United States Patent [19]
Carter et al.

[11] Patent Number: 6,025,289
[45] Date of Patent: Feb. 15, 2000

[54] COLORLESS SILICON CARBIDE CRYSTALS

[75] Inventors: Calvin H. Carter, Cary; Valeri F. Tsvetkov, Durham; Robert C. Glass, Chapel Hill, all of N.C.

[73] Assignee: Cree Research, Inc., Durham, N.C.

[21] Appl. No.: 08/984,938

[22] Filed: Dec. 4, 1997

Related U.S. Application Data

[62] Division of application No. 08/596,526, Feb. 5, 1996, Pat. No. 5,718,760.

[51] Int. Cl.[7] .......................... C04B 35/565; C30B 29/36
[52] U.S. Cl. ...................... 501/86; 252/62.3 C; 117/951; 501/88
[58] Field of Search ....................... 252/62.3 C; 117/951; 501/86, 88

[56] References Cited

U.S. PATENT DOCUMENTS

| | | |
|---|---|---|
| Re. 34,861 | 2/1995 | Davis et al. . |
| 3,956,032 | 5/1976 | Powell et al. .................. 252/62.3 C |
| 4,866,005 | 9/1989 | Davis et al. ........................ 437/100 |
| 4,966,860 | 10/1990 | Suzuki et al. . |
| 5,030,580 | 7/1991 | Furukawa et al. . |
| 5,363,798 | 11/1994 | Yoder ................................. 117/89 |
| 5,433,167 | 7/1995 | Furukawa et al. . |
| 5,723,391 | 3/1998 | Hunter et al. ...................... 501/86 |

OTHER PUBLICATIONS

Introduction to Ceramics, W. D. Kingery et al., Second Edition, John Wiley & Sons, pp. 676–679 No Date.

Optical and Electronic Properties of SiC, W.H. Choyke, *The Physics and Chemistry of Carbides, Nitrides and Borides*, Manchester, England, Sep. 1989, pp. 1–25 35 al.

Woo Sik Yee, "Bulk Crystal Growth of 6–H–SiC on Polytype Controlled Substrates through Vapor Phase and Characterization,", Journal of Crystal Growth; Dec. 2, 1991; vol. 15, No. 1/04; Amsterdam.

*Primary Examiner*—Karl Group
*Attorney, Agent, or Firm*—Philip Summa, Patent Attorney

[57] ABSTRACT

Large single crystals of silicon carbide are grown in a furnace sublimation system. The crystals are grown with compensating levels of p-type and n-type dopants (i.e., roughly equal levels of the two dopants) in order to produce a crystal that is essentially colorless. The crystal may be cut and fashioned into synthetic gemstones having extraordinary toughness and hardness, and a brilliance meeting or exceeding that of diamond.

10 Claims, No Drawings

COLORLESS SILICON CARBIDE CRYSTALS

This application is a division of application Ser. No. 08/596,526, filed Feb. 5, 1996, now U.S. Pat. No. 5,718,760.

FIELD OF THE INVENTION

The invention relates to the growth of silicon carbide crystals. More particularly, the invention relates to the growth of transparent, monocrystalline, colorless silicon carbide crystals. Because of their durability and other advantageous physical and crystal properties, these crystals may be cut and fashioned into finished gemstones having the fire and brilliance of diamond.

BACKGROUND OF THE INVENTION

Silicon carbide (SiC) is rarely found in nature. It has, however, been manufactured for more than eighty years, in crystalline form, for abrasive products. Silicon carbide crystals found in nature and in abrasive products are generally black and not translucent because they contain substantial levels of impurity atoms.

Because of the theoretically quite favorable electronic properties of silicon carbide, significant development activities were initiated during the 1960s and 1970s with the objective of growing large (bulk) crystals of low impurity silicon carbide for use in the production of semiconductor devices. These efforts finally resulted in the commercial availability of relatively low impurity, translucent silicon carbide crystals. These silicon carbide crystals are fabricated and marketed as very thin, green, amber or blue (175 $\mu$m–400 $\mu$m) slices useful for semiconductor devices.

Recently, it has been discovered that relatively low impurity, translucent, single crystal silicon carbide may be grown with a desired color and thereafter cut and fashioned into synthetic gemstones. These gemstones have extraordinary hardness, toughness, chemical and thermal stability, and a high refractive index that produces unparalleled brilliance. The single crystals from which the gemstones are produced have been grown by sublimation according to techniques of the type described in U.S. Pat. No. Re. 34,061.

Silicon carbide crystals can be grown in a wide range of colors (including green, blue, red, purple. yellow, amber and black) and shades within each color by the appropriate selection of dopants (e.g., nitrogen and aluminum) and by varying the net doping densities (concentrations). Because of its wide bandgap, undoped ("intrinsic") silicon carbide crystals in the hexagonal or rhombohedral forms are inherently colorless. Thus, silicon carbide crystals offer the potential to be cut and fashioned into gemstones of many various appearances, including that of diamond.

Although the colored crystals have proven relatively easy to produce, problems have been encountered in creating the exceedingly impurity-free sublimation system environment necessary for growing undoped, colorless silicon carbide. Because colorless silicon carbide gemstones have an extraordinary appeal, there is a need for a more cost effective and reliable process for growing large single crystals of silicon carbide in colorless form.

SUMMARY OF THE INVENTION

The present invention, in one broad aspect, is the discovery that large, transparent, colorless silicon carbide crystals may be grown in a sublimation system where compensating levels of n-type and p-type dopants are introduced into the crystals's lattice structure. The compensated levels of p-type and n-type dopants (i.e., roughly equal levels of the two dopants) serve to produce a colorless crystal by canceling each other out in terms of the production of color centers in the crystal. The compensation is best carried out at low carrier levels. For example, the preferred n-type dopant, nitrogen, may be introduced into the lattice only at those low levels dictated by "background" atmospheric nitrogen present in the sublimation system. A like amount of p-type dopant, e.g., aluminum, may be introduced via the sublimation powder or gas at a level sufficient to compensate for the background level of nitrogen. Thus, in one aspect, the present invention may be described as a colorless single crystal of silicon carbide grown with compensated levels of n-type and p-type dopants. These crystals may be cut and fashioned into brilliant colorless synthetic gemstones.

In another aspect, the invention may be defined as a method of producing a colorless single crystal of silicon carbide comprising the step of growing the single crystal of silicon carbide by a sublimation technique wherein compensated levels of p-type and n-type dopants are introduced into the crystal lattice structure.

DETAILED DESCRIPTION OF THE INVENTION

It is to be understood at the outset of the description which follows that persons of skill in the appropriate arts may modify the invention as herein described while still achieving the favorable results of this invention. Accordingly, the description which follows is to be understood as being a broad, teaching disclosure directed to persons of skill in the appropriate arts, and not as limited upon the present invention.

Additionally, a number of the definitions, techniques and other aspects in the field of natural and synthetic gems and gemstones are well known to those of ordinary skill in this art. Relevant background and related information can be found, for example, in Volume 7 of the *McGraw-Hill Encyclopedia of Science & Technology*, 7th Ed. (1992) at pages 651–659. It will be understood, of course, that this source is exemplary of the general knowledge in this art, rather than any limitation of the present invention.

In a preferred manner of practicing the invention, the growth of large, colorless single crystals of silicon carbide is achieved by introducing a polished monocrystalline seed crystal of silicon carbide of a desired polytype into the furnace of a sublimation system along with silicon and carbon containing source gas or powder (source material). The source material is heated to a temperature that causes the source material to create a vapor flux that deposits vaporized Si, $Si_2C$, and $SiC_2$ to the growth surface of the seed crystal. The reproducible growth of a single selected polytype on the seed crystal is achieved by maintaining a constant flux of Si, $Si_2C$ and $SiC_2$, and controlling the thermal gradient between the source material and the seed crystal. The growth procedure described above is set forth in more detail in U.S. Pat. No. Re. 34,861, the teachings of which are incorporated entirely herein by reference.

During the growth process of the present invention, roughly equal amounts of p-type and n-type dopants are maintained in the atmosphere of the sublimation furnace so that compensated levels of these two dopant types are introduced into the crystal lattice structure. In one preferred embodiment, the n-type dopant is nitrogen. The nitrogen source is the nitrogen present in the furnace atmosphere at "background" levels. Therefore, according to this embodiment, a p-type dopant, preferably aluminum, is added to the source powder in an appropriate amount so that the nitrogen and aluminum are incorporated into the crystal lattice structure in compensated amounts. In this regard, "compensated," "compensated amount," "compensated level," and like terms, are used to refer to those roughly equal levels of p-type and n-type dopant atoms incorporated into the silicon carbide crystal lattice structure whereby the crystal is rendered essentially colorless.

In this regard, the terms "compensation" or "compensated" are also used in describing the electronic properties of a crystal, and likewise describes a semiconductor material that contains (frequently intentionally) both p and n-type dopants, including material in which one or the other predominates; e.g. a "compensated p-type material." Also, some uses refer to material in which p or n predominate as being "overcompensated" rather than simply "compensated." Thus, the terms "compensated" and "overcompensated" are familiar to those of ordinary skill in the semiconductor field.

It has been found desirable to compensate p-type and n-type dopants at low carrier levels. Thus, prior to initiating the sublimation growth process, the background level of atmospheric nitrogen in the furnace is desirably reduced to a relatively low level, for example, a level that will generally create an n-type dopant level in the crystal lattice on the order of about $1\times10^{16}$ to $1\times10^{18}$ atoms/cubic centimeter ($cm^{-3}$) with a more preferred range being between about $1\times10^{17}$ $cm^{-3}\times5$ to $10^{17}$ $cm^{-3}$. Reducing the level of atmospheric nitrogen in the furnace can be achieved by methods known in the art, typically, by backfilling with an inert gas such as argon, following by evacuating the furnace to very low pressure.

The compensated level of the p-type dopant is not absolutely critical provided it produces a crystal having sufficient colorless properties for the intended end use. Thus, broadly stated, the invention encompasses compensation that meets this goal, whether the dopant density is greater for the p-type or n-type dopant. It has been found desirable, however, especially where the n-type dopant is nitrogen and the p-type dopant is aluminum, to have a greater density of aluminum atoms in the crystal lattice. Thus, in a preferred manner of practicing the invention, the level of aluminum atoms is in the range of one to five times that of the nitrogen atoms, with a more preferred range being one to two times.

The reasons for a somewhat greater density of p-type S aluminum atoms are two-fold. First, p-type aluminum doping alone tends to impart a blue color to silicon carbide crystals, while n-type nitrogen doping alone tends to impart a green or amber color. Because colorless brilliance for gemstone applications is desired, a slight blue tint is preferable to a slight green or amber tint. Generally speaking, the preference arises from the aesthetic viewpoint that a blue tint is less detrimental than some other tint and, in some cases, is deemed desirable. The second reason for erring on the side of aluminum overcompensation is that aluminum is a deeper level dopant than nitrogen. Thus, at room temperature, the crystal will contain fewer active carriers due to an overcompensation of nitrogen. Because active carrier concentration is directly linked to the creation of color centers within the crystal, an overcompensation of aluminum is more likely to reduce the color of the crystal than will an overcompensation of nitrogen.

It will be appreciated that other dopants may be used, and that the dopants may be used at other densities. For example, the p-type dopant may be boron or beryllium, or other Group I, II or III elements. Similarly, other Group V elements may be used as n-type dopants in silicon carbide.

The present invention may be utilized to grow colorless crystals of different polytypes. In this regard, silicon carbide is a complex material system that forms more than 150 different polytypes, each having different physical and electronic properties. The different polytypes can be classified in three basic terms: cubic, rhombohedral and hexagonal. Both the rhombohedral and hexagonal forms can occur in a number of different atomic arrangements that vary according to atomic stacking sequence. According to the invention, the preferred polytypes are 2H, 6H, 4H, 8H, 15R and 3C.

Large, colorless single crystals of silicon carbide grown by the techniques described above are ideally suited for use as gemstone materials. The colorless single crystals, if large enough, are first cut into a number of smaller pieces that serve as the rough gemstone material. The rough gemstones thereafter may be fashioned into finished gemstones by utilizing equipment currently employed in the art for fashioning diamonds and natural colored gemstones. Preferably, the silicon carbide gemstones of the invention are fashioned with precision diamond cuts to take advantage of the extraordinarily high refractive index of the silicon carbide material.

As noted earlier, those techniques required to turn an appropriate material into a final gemstone are generally well understood, and can be applied to the silicon carbide material of the present invention without undue experimentation.

Although the invention has been described in connection with certain embodiments, it will be appreciated that modifications may be made without departing from the true spirit and scope of the invention.

That which is claimed:

1. A colorless single crystal of silicon carbide having compensated levels of nitrogen as an n-type dopant and aluminum as a p-type dopant; said nitrogen dopant and said aluminum dopant each being present in the crystal at a concentration of between about $1\times10^{16}$ $cm^{-3}$ and $1\times10^{18}$ $cm^{-3}$; and with the concentration of aluminum dopant atoms being in the range of about one to five times that of nitrogen dopant atoms.

2. A colorless single crystal of silicon carbide as claimed in claim 1 wherein each dopant type is present in the crystal at a concentration of between about $1\times10^{17}$ $cm^{-3}$ and $5\times10^{17}$ $cm^{-3}$.

3. A colorless single crystal of silicon carbide as claimed in claim 1 wherein the concentration of aluminum atoms is between about one and two times the concentration of nitrogen atoms.

4. A colorless single crystal of silicon carbide as claimed in claim 1 wherein nitrogen atoms are present at a concentration dictated by background levels of nitrogen.

5. A colorless single crystal of silicon carbide as claimed in claim 1 wherein the polytype of the silicon carbide single crystal is selected from the group consisting of 2H, 6H, 4H, 8H, 15R and 3C.

6. A colorless single crystal of silicon carbide having compensated levels of nitrogen as an n-type dopant and boron as a p-type dopant; said nitrogen dopant and said boron dopant each being present in the crystal at a concentration of between about $1\times10^{16}$ $cm^{-3}$ and $1\times10^{17}$ $cm^{-3}$.

7. A colorless single crystal of silicon carbide as claimed in claim 6 wherein the concentration of boron atoms is between about one and two times the concentration of nitrogen atoms.

8. A colorless single crystal of silicon carbide as claimed in claim 6 wherein nitrogen atoms are present at a concentration dictated by background levels of nitrogen.

9. A colorless single crystal of silicon carbide as claimed in claim 6 wherein the polytype of the silicon carbide single crystal is selected from the group consisting of 2H, 6H, 4H, 8H, 15R and 3C.

10. A colorless single crystal of silicon carbide as claimed in claim 6 wherein the concentration of boron atoms and nitrogen atoms are substantially equal.

* * * * *